(12) United States Patent
Li (10) Patent No.: US 9,746,710 B2
(45) Date of Patent: Aug. 29, 2017

(54) QUANTUM DOT LIGHT SOURCE DEVICE, BACKLIGHT MODULE, AND LIQUID CRYSTAL DISPLAY DEVICE

(71) Applicant: HISENSE ELECTRIC CO., LTD., Qingdao (CN)

(72) Inventor: Fulin Li, Qingdao (CN)

(73) Assignees: HISENSE ELECTRIC CO., LTD., Qingdao (CN); HISENSE USA CORPORATION, Suwanee, GA (US); HISENSE INTERNATIONAL CO., LTD., Qingdao (CN)

( * ) Notice: Subject to any disclaimer, the term of this patent is extended or adjusted under 35 U.S.C. 154(b) by 0 days.

(21) Appl. No.: 15/352,988

(22) Filed: Nov. 16, 2016

(65) Prior Publication Data

US 2017/0068132 A1    Mar. 9, 2017

(30) Foreign Application Priority Data

Jun. 3, 2016 (CN) .......................... 2016 1 0385453

(51) Int. Cl.
| | | |
|---|---|---|
| *H01L 33/50* | (2010.01) | |
| *H01L 33/52* | (2010.01) | |
| *G02F 1/1335* | (2006.01) | |
| *H01L 33/58* | (2010.01) | |

(52) U.S. Cl.
CPC .. *G02F 1/133603* (2013.01); *G02F 1/133605* (2013.01); *H01L 33/502* (2013.01); *G02F 2001/133614* (2013.01); *G02F 2202/36* (2013.01); *H01L 33/505* (2013.01); *H01L 33/58* (2013.01)

(58) Field of Classification Search
CPC ....... H01L 33/58–33/60; H01L 33/50–33/508; G02F 1/133603; G02F 1/133606
See application file for complete search history.

(56) References Cited

U.S. PATENT DOCUMENTS

| | | | | |
|---|---|---|---|---|
| 2007/0001182 | A1* | 1/2007 | Schardt ................ | C09K 11/02 257/98 |
| 2007/0012940 | A1* | 1/2007 | Suh ..................... | H01L 33/507 257/99 |
| 2007/0273274 | A1* | 11/2007 | Horiuchi ............... | C09K 11/06 313/504 |
| 2010/0110728 | A1* | 5/2010 | Dubrow ............... | C09K 11/025 362/615 |
| 2012/0113354 | A1* | 5/2012 | Park .................. | G02F 1/133606 349/62 |
| 2013/0009180 | A1* | 1/2013 | Kim ..................... | G02B 6/0026 257/89 |

(Continued)

*Primary Examiner* — Mariceli Santiago
(74) *Attorney, Agent, or Firm* — Harness, Dickey & Pierce, P.L.C.

(57) ABSTRACT

The disclosure provides a quantum dot light source device, a backlight module, and a liquid crystal display device, where the quantum dot light source device includes an upper substrate, a lower substrate, and a quantum dot material layer packaged between the upper substrate and the lower substrate, and reflection points are arranged on the upper substrate so that the reflectivity of light rays by the reflection points at the center of the upper substrate is higher than the reflectivities of the light rays at the peripheral edges thereof.

20 Claims, 6 Drawing Sheets

(56) References Cited

U.S. PATENT DOCUMENTS

| | | | |
|---|---|---|---|
| 2013/0062591 A1* | 3/2013 | Jun | H01L 33/505 |
| | | | 257/9 |
| 2013/0207141 A1* | 8/2013 | Reiherzer | H01L 33/505 |
| | | | 257/98 |
| 2016/0043286 A1* | 2/2016 | Zehetner | H01L 33/505 |
| | | | 257/98 |
| 2016/0322543 A1* | 11/2016 | Jeon | H01L 33/505 |

* cited by examiner

QUANTUM DOT LIGHT SOURCE DEVICE, BACKLIGHT MODULE, AND LIQUID CRYSTAL DISPLAY DEVICE

CROSS-REFERENCE TO RELATED APPLICATION

This application claims the benefit and priority of Chinese Patent Application No. 201610385453.X filed Jun. 3, 2016. The entire disclosure of the above application is incorporated herein by reference.

FIELD

The present disclosure relates to the field of display technologies, and particularly to a quantum dot light source device, a backlight module, and a liquid crystal display device.

BACKGROUND

This section provides background information related to the present disclosure which is not necessarily prior art.

A liquid crystal display device generally includes a liquid crystal panel, a mechanical frame, an optical component, and some circuit boards. Since liquid crystals themselves do not emit any light, some backlight sources need to be configured for a picture to be displayed, where a backlight module is configured to provide the liquid crystal display device with backlight sources uniform in brightness and distribution to thereby enable the liquid crystal display device to display the picture normally.

The backlight module can be categorized into a backlight module from which light is incident at the sides thereof, and a backlight module from which light is incident immediately upward, dependent upon different positions at which light is incident from the light sources, where the light sources in the backlight module from which light is incident immediately upward are light sources, e.g., Light-emitting Diodes (LEDs), arrayed on the backside of the backlight module to emit light rays transmitted through a light guiding plate, an optically enhancing sheet, and other optical film sheets, thus resulting in planar backlight sources which are distributed uniformly; and the light sources in the backlight module from which light is incident at the sides thereof are arranged at the sides of the backlight module to emit light rays to the light guiding plate, so that the light rays passing the light guiding plate and the optical film sheets are converted into planar backlight sources which are distributed uniformly.

Figure 1:
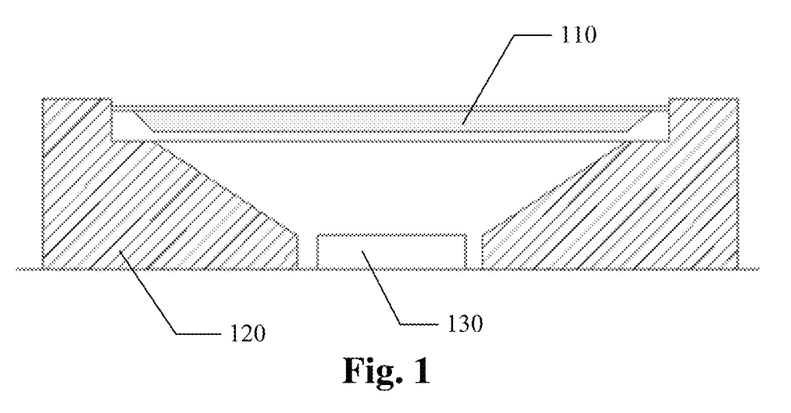
FIG. 1 is a schematic structural diagram of a quantum dot light source device package including a blue LED chip and a quantum dot material in the relative art.

In order to provide backlight in a wide gamut of coloration, such a solution can be adopted in both the backlight module from which light is incident at the sides thereof, and the backlight module from which light is incident immediately upward that blue LED light-emitting chips emit blue light to excite a quantum dot material to generate white light in a wide gamut of coloration up to 100% NTSC. FIG. 1 is a schematic structural diagram of a quantum dot light source device package including a blue LED chip and a quantum dot material, and as illustrated in FIG. 1, the blue LED chip 130 is arranged on a PCB printed board, and a package bracket 120 is affixed on the PCB printed board in the form of a groove, where the LED chip is centered on the bottom plate of the groove, and a quantum dot layer 110 formed by packaging a quantum dot material between two layers of glasses is arranged at the bottom end of the package bracket 120. In order to prevent the quantum dot material from being invalidated at high temperature (above 70° C.), a thermally isolating layer, e.g., a thermally isolating material layer, is arranged, or an air layer over some distance is reserved between the quantum dot layer 110 and the blue LED chip.

SUMMARY

This section provides a general summary of the disclosure, and is not a comprehensive disclosure of its full scope or all of its features.

Embodiments of the disclosure provide a quantum dot light source device, a backlight module, and a liquid crystal display device.

In a first aspect, some embodiments of the disclosure provide a quantum dot light source device including:

a printed circuit board and a quantum dot package component, both of which are packaged into a closed cavity through a package bracket, wherein:

the printed circuit board is configured to power the quantum dot light source device; and an LED light-emitting chip is arranged on the side of the printed circuit board inside the package cavity, and configured to generate exciting light; and the quantum dot package component includes an upper substrate, a lower substrate, and a quantum dot material layer packaged between the upper substrate and the lower substrate, the quantum dot material layer is excited by the exciting light to generate excited light, there is at least one reflection point arranged on the upper substrate, and there are more light rays reflected by the at least one reflection point at the center of the upper substrate than light rays reflected at the peripheral edges of the upper substrate.

In a second aspect, some embodiments of the disclosure further provide a backlight module including a fixing component, a quantum dot light source device, and a light-uniformizing component, wherein:

the fixing component is configured to assemble the backlight module;

the quantum dot light source device is located at the light incidence side of the light-uniformizing component;

the light-uniformizing component is configured to process a light source provided by the quantum dot light source device into a planar light source projected onto a liquid crystal display panel;

the quantum dot light source device includes:

a printed circuit board and a quantum dot package component, both of which are packaged into a closed cavity through a package bracket, wherein:

the printed circuit board is configured to power the quantum dot light source device; and an LED light-emitting chip is arranged on the side of the printed circuit board inside the package cavity, and configured to generate exciting light; and the quantum dot package component includes an upper substrate, a lower substrate, and a quantum dot material layer packaged between the upper substrate and the lower substrate, the quantum dot material layer is excited by the exciting light to generate excited light, there is at least one reflection point arranged on the upper substrate, and there are more light rays reflected by the at least one reflection point at the center of the upper substrate than light rays reflected at the peripheral edges of the upper substrate.

In a third aspect, some embodiments of the disclosure further provide a liquid crystal display device including:

a backlight module, and a liquid crystal display panel arranged above the backlight module, wherein:

the backlight module includes a fixing component, a quantum dot light source device, and a light-uniformizing component, wherein:

the fixing component is configured to assemble the backlight module;

the quantum dot light source device is located at the light incidence side of the light-uniformizing component;

the light-uniformizing component is configured to process a light source provided by the quantum dot light source device into a planar light source projected onto the liquid crystal display panel;

the quantum dot light source device includes:

a printed circuit board and a quantum dot package component, both of which are packaged into a closed cavity through a package bracket, wherein:

the printed circuit board is configured to power the quantum dot light source device; and an LED light-emitting chip is arranged on the side of the printed circuit board inside the package cavity, and configured to generate exciting light; and the quantum dot package component includes an upper substrate, a lower substrate, and a quantum dot material layer packaged between the upper substrate and the lower substrate, the quantum dot material layer is excited by the exciting light to generate excited light, there is at least one reflection point arranged on the upper substrate facing the quantum dot material layer, and there are more light rays reflected by at the center of the upper substrate including the at least one reflection point than light rays reflected at the peripheral edges of the upper substrate.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings.

Figure 2:
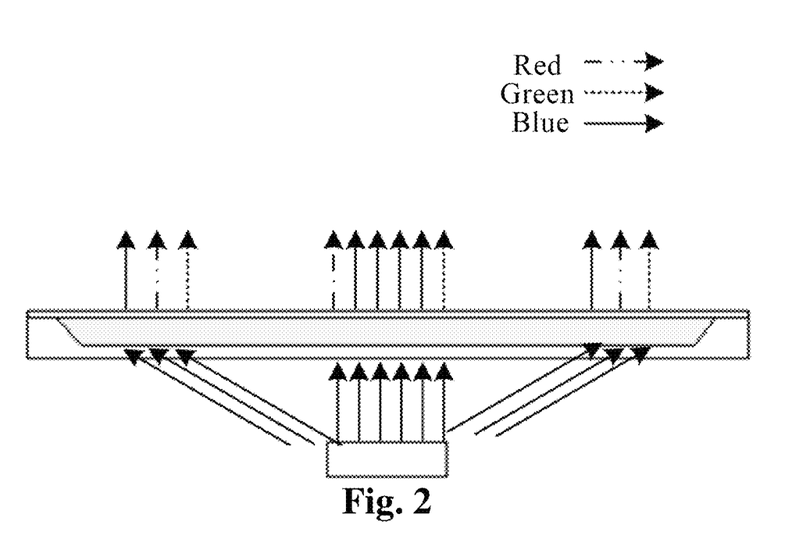
FIG. 2 is a schematic diagram of emitted light rays of the quantum dot light source device in the relative art illustrated in FIG. 1.

FIG. 2 is a schematic diagram of emitted light rays of the quantum dot light source device in the relative art illustrated in FIG. 1, and as illustrated in FIG. 2, light rays emitted from an LED chip diverge at some angle in a Lombard distribution of the optical strength thereof, where the optical strength is increasing at a decreasing emission angle, and decreasing at an increasing emission angle, and typically an air gap layer over some distance is arranged between the light exit face of the LED light-emitting chip, and the planar quantum dot layer, so that there are more photons passing the center of the quantum dot layer, and less photons passing an edge thereof away from the center thereof, so if the quantum dot material is distributed uniformly at the quantum dot layer, then there will be an excessive blue component light at the center, thus resulting in a bluish display, and an insufficient blue component light at the edge, thus resulting in a yellowish display, which may cause the light rays emitted at the different positions in the quantum dot light source device to vary in color.

In the embodiments of the disclosure, reflection points are arranged on an inner wall of an upper substrate of a quantum dot material package component of the quantum dot light source device, where there are more light rays reflected by the reflection points, in the central area than light rays reflected at peripheral edges of the upper substrate, so that there are a higher proportion of light rays reflected on the upper substrate, and a lower proportion of light rays which are transmitted directly through the upper substrate, and in this way, the reflected light rays which are converted again include a higher proportion of red and green components light, and then are further transmitted through the upper substrate and mixed with the directly transmitted light rays into working light rays of the quantum dot light source device. Accordingly there are a high proportion of transmitted and converted again light rays among the working light rays in the central area, and there are a higher proportion of red and green component light among the light rays which are converted again, so that there are a high proportion of light rays which are converted again in the central area to thereby improve the proportion of red and green component light, which can enable together with the characteristic of the Lombard distribution of the LED light-emitting chip, the light rays emitted at the different positions in the quantum dot light source device, including the quantum dots which are distributed uniformly, to substantially remain unvarying in color.

Figure 3:
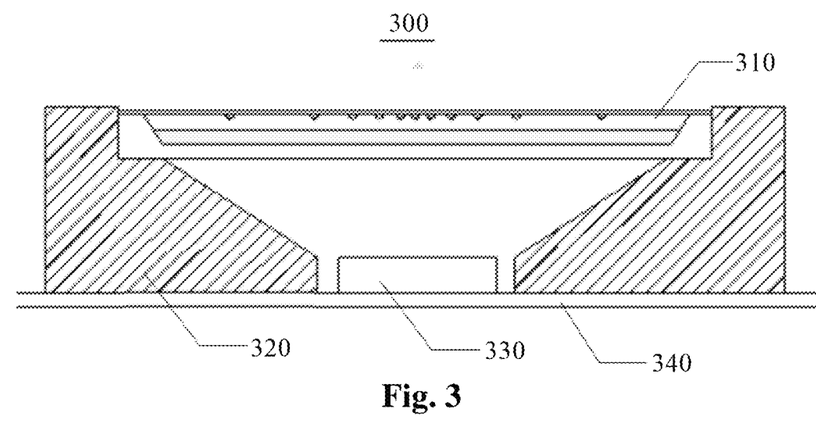
FIG. 3 is a schematic structural diagram of a quantum dot light source device according to some embodiments of the disclosure.
Figure 4:
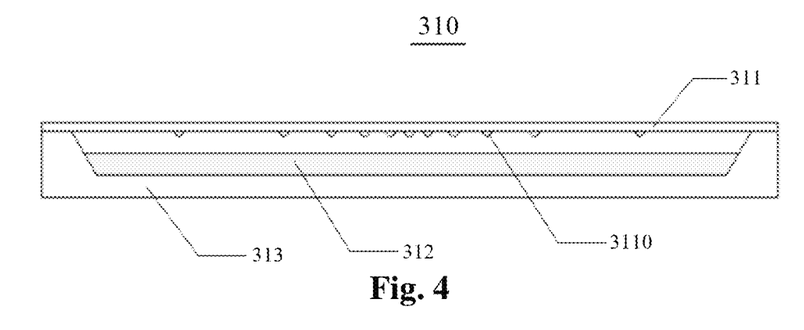
FIG. 4 is a schematic structural diagram of a quantum dot package component according to some embodiments of the disclosure.
Figure 5:
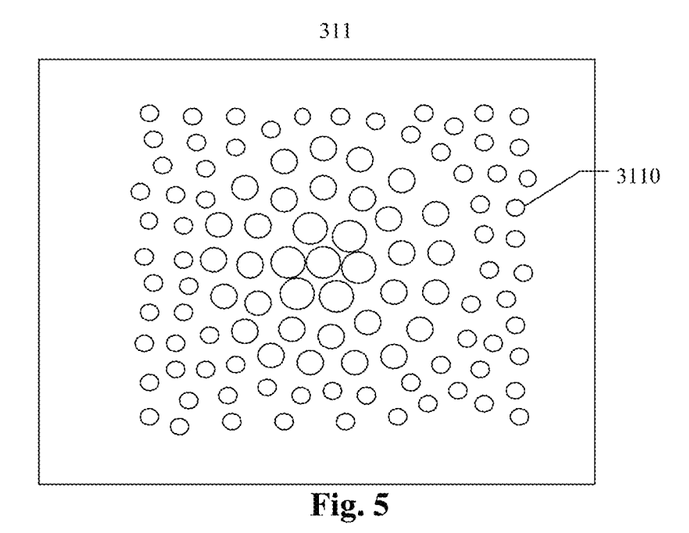
FIG. 5 is a schematic structural diagram of a layout of reflection points on an upper package substrate according to some embodiments of the disclosure.

FIG. 3 is a schematic structural diagram of a quantum dot light source device according to some embodiments of the disclosure; FIG. 4 is a schematic structural diagram of a quantum dot package component according to some embodiments of the disclosure; and FIG. 5 is a schematic structural diagram of a layout of reflection points on an upper package substrate according to some embodiments of the disclosure.

As illustrated in FIG. 3, a quantum dot light source device 300 can be configured for backlight sources in a backlight module from which light is incident immediately upward, and a backlight module from which light is incident at the sides thereof, and can be used as an illumination light source including a printed circuit board 340 and a quantum dot package component 310, both of which are packaged into a closed cavity through a package bracket 320.

The printed circuit board 340 is configured to power the quantum dot light source device 300.

An LED light-emitting chip 330 is arranged on the side of the printed circuit board 340 inside the package cavity, and configured to generate exciting light.

The package bracket 320 includes a bottom end arranged on the printed circuit board 340, where the bottom end thereof can be glued thereon. In order to prevent the exciting light rays emitted from the LED light-emitting chip from being transmitted through the package bracket 320 and the printed circuit board 340, the package bracket 320 and the printed circuit board 340 are made of a non-transparent material.

The quantum dot package component 310 is configured to be excited by the exciting light source to generate excited light, and arranged on the top end of the package bracket 320.

As illustrated in FIG. 4, in order to isolate the quantum dot material from humidity and oxygen, the quantum dot package component 310 includes a quantum dot material layer 312 packaged between an upper substrate 311 and a lower substrate 313, where such a quantum dot material is distributed uniformly in the quantum dot material layer 312 that is exited by the exciting light emitted from the LED light-emitting chip 330, and then generates the excited light, for example, if the LED light-emitting chip 330 generates blue exciting light, and the quantum dot material includes green and red quantum dot material component light which are distributed uniformly at some proportion, then the blue exciting blue will excite the quantum dot material to generate green and red excited light to be mixed with some proportion of blue exciting light, which is transmitted through the quantum dot layer, and thus not converted, into a white light source.

As illustrated in FIG. 4 and FIG. 5, in order to lower the proportion of blue light transmitted through the center of the quantum dot package component, at least one reflection point 3110 is arranged on the upper substrate 311, where the at least one reflection point can be arranged on the side thereof facing the quantum dot material layer 312 (in some other embodiments, the at least one reflection point can also be arranged on the side thereof against the quantum dot material layer 312), and the at least one reflection point 3110 is configured to reflect the light rays excited from the quantum dot material layer 312, so that there are more light rays reflected at the center of the upper substrate 311 than light rays reflected at the peripheral edges of the upper substrate 311. In this way, the light rays exciting the quantum dot material layer 312 includes the blue light which is not converted, and the green and red excited light, and a part of these light rays passing the upper substrate 311 are transmitted, while the other part thereof are reflected to the quantum dot material layer 312, where the blue light in the reflected light rays excites again the quantum dot material in the quantum dot material layer 312, and is converted again into green and red excited light, thus raising the proportion of the green and red light, and lowering the proportion of the blue light, and further transmitted through the upper substrate 311, thus also raising the proportion of the green and red light, and lowering the proportion of the blue light in the total light flux transmitted through the upper substrate 311.

There are a high proportion of light rays reflected at the center of the upper substrate 311, and further there is also a more raised proportion of green and red light in the total light flux transmitted at the center of the upper substrate 311; and on the contrary, there is a low reflectivity at the edges of the upper substrate 311, there are a low proportion of light rays reflected at the edges thereof, and there is also a less raised proportion of green and red light in the total light flux transmitted at the edges of the upper substrate 311, so that the reflection points with different reflectivities can be arranged on the upper substrate 311 to thereby control the proportion of blue light in the total light fluxes transmitted at the respective positions on the upper substrate 311.

By way of an example where there is white balance including a blue component of 50%, and red and green component light of 50%, if there are an edge area with a reflectivity of 0%, and with a transmittivity of 100% for blue light, and a transmittivity of 50% respectively for red and green light, thus resulting in white balance, and a central area with a conversion ratio of 40%, then incident light will be converted once into the blue component of 60%, and the red and green component light of 40%; and if the reflectivity is 50%, then a part of blue light in the 50%-reflected light rays will be converted for the second time into red and green light, so that the proportion of the blue light is 50%*60%*60%=18%, and the proportion of the red and green light is 50%*(40%+60%*40%)=32%, thus resulting in a lowered proportion of the blue light, and a raised proportion of the red and green light in the light resulting from the conversion for the second time; and the resulting light will be reflected again on and transmitted through the upper substrate, and mixed with the directly transmitted light into a working light source in which the proportion of the blue light is 18%+60%*50%=48%, and the proportion of the red and green light is 32%+40%*50%=52%, thus resulting in a significantly raised proportion of the red and green light, and a significantly lowered proportion of the blue light in the working light. Therefore, the problem of excessive blue light at center can be addressed.

To illustrate the present disclosure, the case of a plurality of reflection points arrange on the upper substrate will be taken as an example.

In order to arrange the different reflectivities at the different positions on the upper substrate 311 so that the reflectivity of the light rays at the center of the upper substrate 311 is higher than the reflectivities of the light rays at the peripheral edges thereof, in a possible embodiment, the reflection points 3110 with different sizes and/or at different densities of numbers thereof are arranged for the purpose of controlling their reflectivities, where in a first pattern, the reflection points 3110 with a larger size can be arranged proximate to the center of the upper substrate 311, and the reflection points 3110 with a smaller size can be arranged proximate to the edges thereof; in a second pattern, the reflection points 3110 at a high density of the number thereof can be arranged proximate to the center of the upper substrate 311, and the reflection points 3110 at a low density of the number thereof can be arranged proximate to the edges thereof; in a third pattern, the reflection points 3110 distributed at a gradual density of the number thereof can be arranged from the center of the upper substrate 311 to the edges thereof so that the density of the number thereof is high proximate to the center, and low proximate to the edges; and in a fourth pattern, the reflection points can be arranged particularly in a combination of the patterns above, and as illustrated in FIG. 5, the reflection points 3110 on the upper substrate 311 can be arranged in a combination of the first and second patterns above.

As illustrated in FIG. 5, the reflection points at different densities of their numbers are arranged on the upper substrate 311 so that the reflection points are distributed at the center at a high density of the number thereof, and there are a high proportion of light rays reflected on the upper substrate 31, and a low proportion of light rays transmitted directly through the upper substrate 31. In this way, the reflected light rays are converted again so that there is a higher proportion of red and green light in the resulting light, and then the resulting light is further transmitted through the upper substrate 311, and mixed with the directly transmitted light rays into working light of the quantum dot light source device, so the working light includes a high proportion of the light rays which are converted again, transmitted at the center, and there is a higher proportion of the red and blue light in the light which is converted again. In this way, there is a high proportion of the light which is converted again at the center to thereby more improve the proportion of the red and green light, and accordingly there is a low proportion of the light which is converted again at the edges to thereby less improve the proportion of the red and green light, thus enabling the proportion of the red and green light to become substantially consistent at the center with the edges so as to address such a problem in the relative art that there may be an excessive blue component at the center, thus resulting in a bluish display, and an insufficient blue component at the edges, thus resulting in a yellowish display, which may cause the light rays emitted at the different positions in the quantum dot light source device to vary in color.

In another possible embodiment, also in order to enable the reflectivity of the light rays at the center of the upper substrate 311 to be higher than the reflectivities of the light rays at the edges thereof, the reflection points are arranged at the center of the upper substrate 311, and no reflection points are arranged at the edges thereof, where the reflection points can also be arranged at the center in the first and second patterns as illustrated in FIG. 5. Furthermore the reflection points may be arranged only in some area proximate to the center, and no reflection points will be arranged outside that area, thus relatively lowering the difficulty with processing the reflection points to be arranged with different sizes and at different densities of their numbers. Furthermore since the light rays passing the reflection sheet further need to be processed by a light-uniformizing component, e.g., the light guiding plate, the optical film sheet layer, etc., the boundary of the edge of the area where the reflection points are located is uniformized.

In some other embodiments of the disclosure, in order to raise the reflectivity of the light rays on the upper substrate 311, the surface of the material of the reflection points can be further processed into a mirror surface; or in other some embodiments, in order to raise the reflectivity of the light rays at the center of the upper substrate 311, the surfaces of the reflection point at the center of the upper substrate 310 can be processed as a mirror surface, and the surfaces of the reflection points at the edges of the upper substrate 310 can be processed as a diffusively reflecting surface.

Here in some possible embodiments above in which the reflection points with different reflectivities are arranged, they can be implemented respectively as separate implementations; and in other some possible embodiments, they can be implemented in a combination of one or more thereof. The other possible embodiments in which they are implemented in a combination of one or more thereof will not be enumerated here.

In some variations of the first embodiment of the disclosure, the light source can be a purple LED chip, and the quantum dot material can be a mixture of red, green, and blue quantum dot materials, although other combinations thereof will occur to those skilled in the art.

In the first embodiment, the shape of the light exit face of the quantum dot light source device can be a square, or can be circular, or can be planar, or can be curved, although the embodiment of the disclosure will not be limited thereto.

In order to further address the effect of thermally isolating the quantum dot material, a thermally isolating gap is arranged between the quantum dot package component 310 and the LED light-emitting chip, for example, inert gas is packaged in the cavity.

In order to further address the effect of thermally isolating the quantum dot material, and the firmness of the light source device, a thermally solidifiable adhesive is arranged between the quantum dot package component 310 and the LED light-emitting chip to fill the gap between the quantum dot package component 310 and the LED light-emitting chip.

Figure 6:
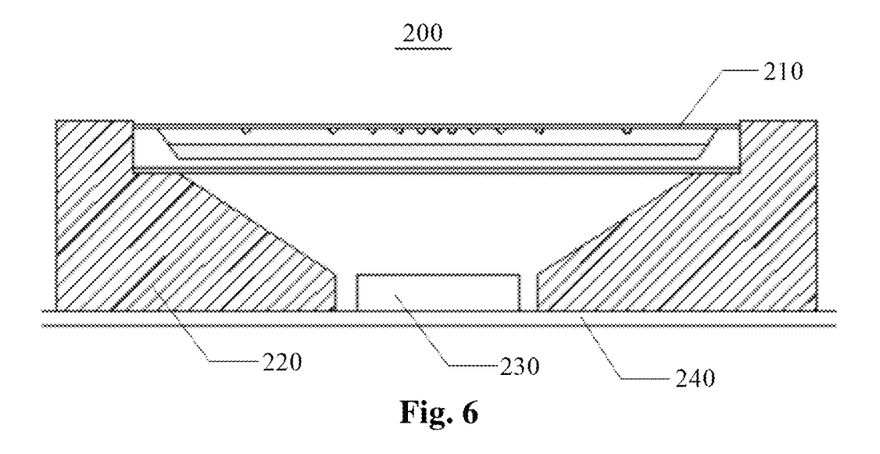
FIG. 6 is a schematic structural diagram of another quantum dot light source device according to some embodiments of the disclosure.
Figure 7:
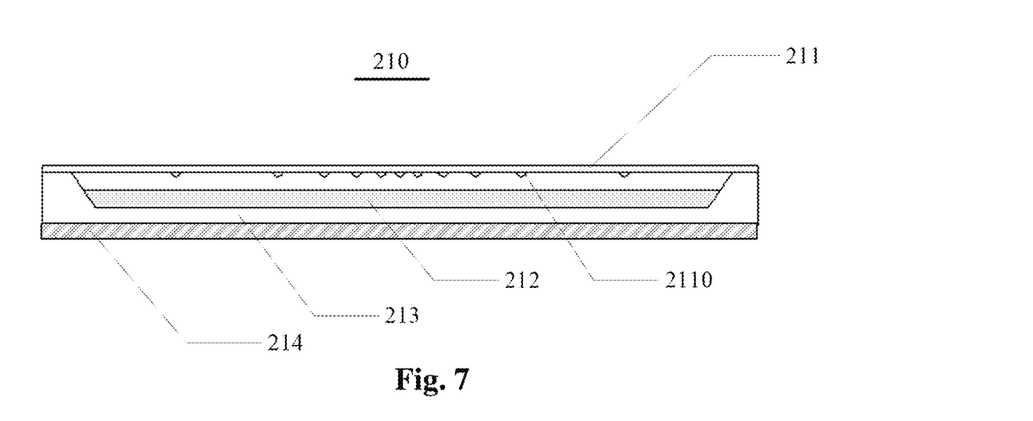
FIG. 7 is a schematic structural diagram of a quantum dot package component according to some embodiments of the disclosure.
Figure 8:
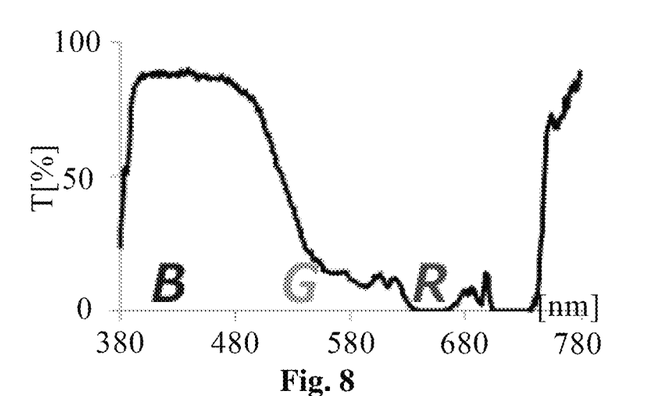
FIG. 8 is a schematic diagram of a light-transmitting characteristic of a dichroic light-transmitting layer according to some embodiments of the disclosure.
Figure 9:
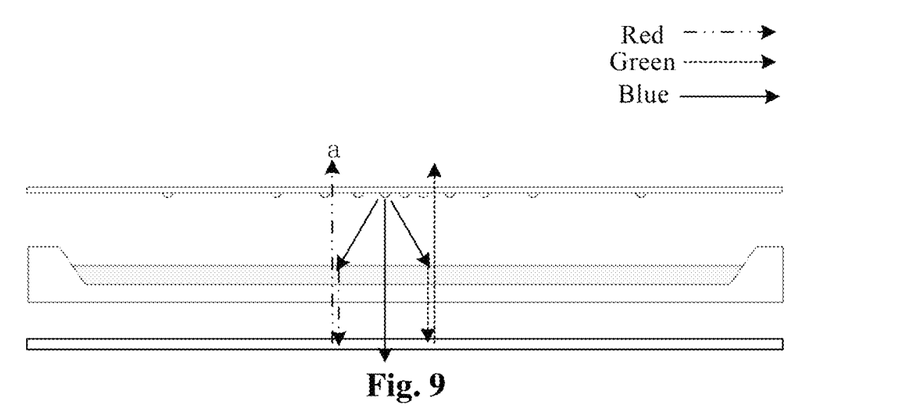
FIG. 9 is a schematic diagram of an optical characteristic of a quantum dot light source device according to some embodiments of the disclosure.

FIG. 6 is a schematic structural diagram of another quantum dot light source device according to some embodiments of the disclosure; FIG. 7 is a schematic structural diagram of a quantum dot package component according to some embodiments of the disclosure; FIG. 8 is a schematic diagram of a light-transmitting characteristic of a dichroic light-transmitting layer according to some embodiments of the disclosure; and FIG. 9 is a schematic diagram of an optical characteristic of a quantum dot light source device according to some embodiments of the disclosure.

The structure illustrated in FIG. 7 is different from the structure illustrated in FIG. 4 in such a dichroic light-transmitting layer arranged on a lower substrate of the quantum dot package component that can be configured to transmit light at the wavelength of an exciting light source, and to reflect light at the wavelength of an excited light source, for example, if the LED light-emitting chip emits blue exciting light to excite the red and green quantum dot materials to generate red and green excited light, then there will be such a light-transmitting characteristic of the dichroic light-transmitting layer that transmits light in the blue band, and reflects light in the red and green bands.

As illustrated in FIG. 6, the quantum dot light source device 200 includes:

A PCB printed circuit board 240 is configured to power the quantum dot light source device 200.

An LED light-emitting chip 230 is arranged on the PCB printed circuit board 240.

A package bracket 220 includes a bottom end arranged on the printed circuit board 240, where the bottom end thereof can be glued thereon, and the package bracket 220 is made of a non-transparent material.

A quantum dot package component 210 is arranged on the top end of the package bracket 220, where a closed cavity is defined by the PCB printed circuit board 240, the package bracket 220, and the quantum dot package component 210, the LED light-emitting chip 230 is located on the bottom of the cavity, and the quantum dot package component 210 is located on the top of the cavity.

As illustrated in FIG. 7, the quantum dot package component 210 includes a quantum dot material layer 112 packaged by an upper substrate 211 and a lower substrate 213, a dichroic light-transmitting layer 214 arranged on the lower surface of the lower substrate 213, and reflection points arranged on the side of the upper substrate 211 proximate to a quantum dot material layer 212 so that the reflectivity of light rays by the reflection points at the center of the upper substrate 211 is higher than the reflectivities of the light rays at the peripheral edges thereof, where a quantum dot material is distributed uniformly in the quantum dot material layer 212, and the dichroic light-transmitting layer 214 is configured to transmit light at the wavelength of an exciting light source, and to reflect light at the wavelength of an excited light source.

In other possible embodiments, a dichroic light-transmitting layer 214 is arranged on such an upper surface of the lower substrate 213 that is the surface thereof proximate to the quantum dot material layer 212.

A repeated description of those identical component light in FIG. 7 to FIG. 4 will be omitted here.

If the exciting light source is light in the blue band, and the excited light is light in the red and green bands, then there will be such a characteristic of the dichroic light-transmitting layer 214 that more transmits the light in the blue band, and less transmits the light in the red and green bands as illustrated in FIG. 8.

As illustrated in FIG. 9, the light rays reflected by the reflection points include the exciting light and the excited light, for example, the exciting light is the blue light, and the excited light is the red and green light, where the light rays are reflected in the area proximate to the center to the quantum dot material layer 212, and the blue light excites again the quantum dot material, and is converted into red and green light, so that there are a lowered proportion of the blue component, and a raised proportion of the red and green light, in the part of the light rays reflected by the reflection points. However after the quantum dot material is excited by the reflected light rays, the light rays are diffused in the respective directions, where a part of the light is reflected again on and transmitted through the upper substrate 211, and the other part of the light is transmitted through the lower substrate 213, and then the blue light rays b are transmitted directly through the dichroic light-transmitting layer 214, and the red light a and the blue light c is reflected, and thereafter transmitted through the upper substrate 211, thus further improving the proportion of the red and green light in the working light resulting from the light being transmitted so as to facilitate a lowered proportion of the blue light in the area proximate to the center.

In some embodiments of the disclosure, there is provided a backlight module from which light is incident immediately upward, and in which a quantum dot light source device is configured to provide a light source.

Figure 10:
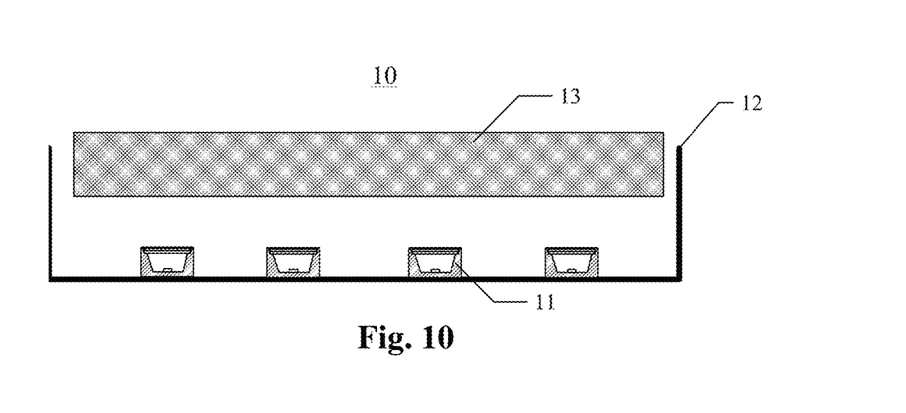
FIG. 10 is a schematic structural diagram of a backlight module from which light is incident immediately upward according to some embodiments of the disclosure.

FIG. 10 is a schematic structural diagram of a backlight module from which light is incident immediately upward according to some embodiments of the disclosure, and as illustrated in FIG. 10, the backlight module 10 from which light is incident immediately upward includes:

A fixing component 12 is configured to assemble the backlight module 10 from which light is incident immediately upward, e.g., a back plate, an adhesive frame, or another connecting component.

A quantum dot light source device 11 is located immediately below the backlight module 10 from which light is incident immediately upward, where the quantum dot light source device 11 is any one of the quantum dot light source devices in FIG. 3 and FIG. 6.

A light-uniformizing component 13 is configured to process a light source provided by the quantum dot light source device 11 into a planar light source projected onto a liquid crystal display panel.

Figure 11:
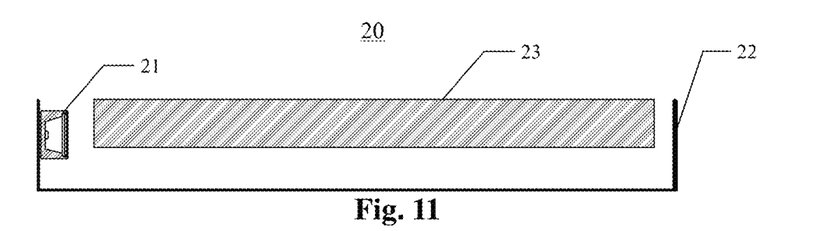
FIG. 11 is a schematic structural diagram of a backlight module from which light is incident at the sides thereof according to some embodiments of the disclosure.

In some embodiments of the disclosure, there is provided a backlight module from which light is incident at the sides thereof, and in which a quantum dot light source device is configured to provide a light source FIG. 11 is a schematic structural diagram of a backlight module from which light is incident at the sides thereof according to some embodiments of the disclosure, and as illustrated in FIG. 11, the backlight module 20 from which light is incident immediately upward includes:

A fixing component 22 is configured to assemble the backlight module 20 from which light is incident at the sides thereof, e.g., a back plate, an adhesive frame, or another connecting component.

A quantum dot light source device 21 is located immediately below the backlight module 20 from which light is incident at the sides thereof, where the quantum dot light source device 11 is any one of the quantum dot light source devices in FIG. 3 and FIG. 6.

A light-uniformizing component 23 is configured to process a light source provided by the quantum dot light source device 21 into a planar light source projected onto a liquid crystal display panel.

In some embodiments of the disclosure, there is further provided a liquid crystal display device including:

The backlight module from which light is incident immediately upward, as illustrated in FIG. 10, or the backlight module from which light is incident at the sides thereof, as illustrated in FIG. 11, and a liquid crystal display panel arranged above the backlight module, where the backlight module is configured to provide the liquid crystal display panel with display light rays to enable the liquid crystal display panel to display a picture.

Figure 12:
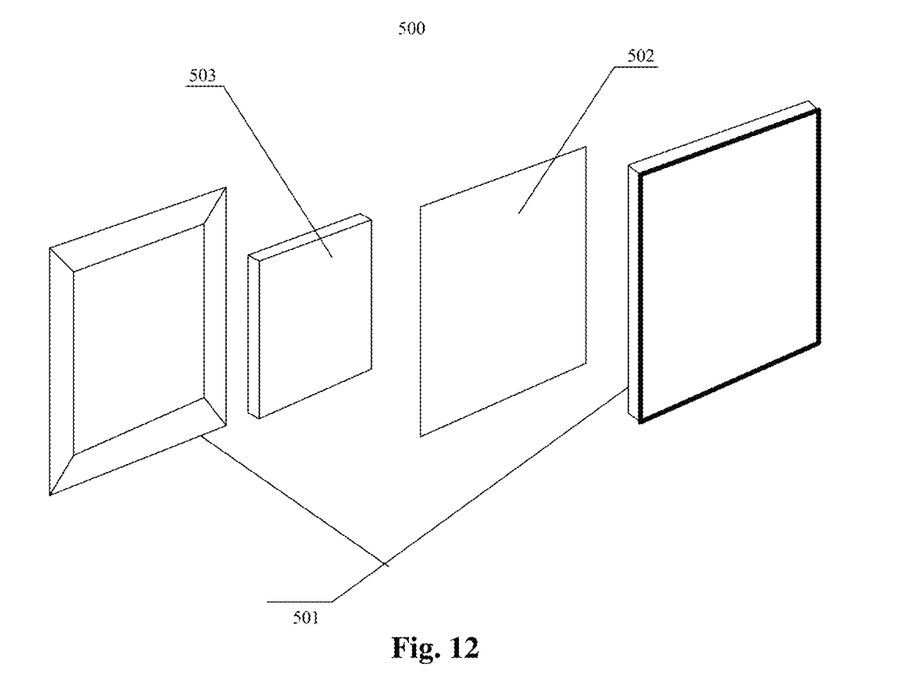
FIG. 12 is a schematic structural diagram of a liquid crystal display device according to some embodiments of the disclosure.

FIG. 12 is a schematic structural diagram of a liquid crystal display device according to some embodiments of the disclosure, and as illustrated in FIG. 12, the liquid crystal display device 500 according to this embodiment includes a housing 501, a liquid crystal display panel 502, and a backlight module 503 which can be structured as in any one of the embodiments of the backlight module as illustrated in FIG. 10 and FIG. 11, so a repeated description thereof will be omitted here, where the housing 501 can include a front housing and a back housing.

In some other possible embodiments of the disclosure, the housing 501 can be omitted, but the appearance and the functions of the housing 501 can be integrated on the backlight module 503.

In a real application, the liquid crystal display panel can be a thin film transistor Liquid Crystal Display (LCD).

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A quantum dot light source device, comprising:
a printed circuit board and a quantum dot package component, both of which are packaged into a closed cavity through a package bracket, wherein:
the printed circuit board is configured to power the quantum dot light source device; and an LED light-emitting chip is arranged on the side of the printed circuit board inside the package cavity, and configured to generate exciting light; and
the quantum dot package component comprises an upper substrate, a lower substrate, and a quantum dot material layer packaged between the upper substrate and the lower substrate, the quantum dot material layer is excited by the exciting light to generate excited light, there is at least one reflection point arranged on the upper substrate, and there are more light rays reflected by the at least one reflection point at the center of the upper substrate than light rays reflected at the peripheral edges of the upper substrate.

2. The quantum dot light source device according to claim 1, wherein when there are a plurality of reflection points arranged on the upper substrate, the density of the reflection points is decreasing gradually from the center of the upper substrate to the edges thereof.

3. The quantum dot light source device according to claim 1, wherein when there are a plurality of reflection points arranged on the upper substrate, the size of the reflection points at the center of the upper substrate is larger than the size of the reflection points at the edges of the upper substrate.

4. The quantum dot light source device according to claim 1, wherein the surfaces of the at least one reflection point is mirror surface.

5. The quantum dot light source device according to claim 1, wherein when there are a plurality of reflection points arranged on the upper substrate, the surfaces of the reflection points at the center of the upper substrate are mirror surfaces, and the surfaces of the reflection points at the edges of the upper substrate are diffusively reflecting surfaces.

6. The quantum dot light source device according to claim 1, wherein the reflection points are arranged on the side of the upper substrate facing the quantum dot material layer, or the side of the upper substrate against the quantum dot material layer.

7. The quantum dot light source device according to claim 1, wherein there is a dichroic light-transmitting layer arranged on the lower substrate, which can be configured to transmit the exciting light, and to reflect the excited light.

8. The quantum dot light source device according to claim 7, wherein the dichroic light-transmitting layer is arranged on the upper or lower surface of the lower substrate.

9. The quantum dot light source device according to claim 1, wherein the LED light-emitting chip generates blue exciting light, and the quantum dot material is red and green quantum materials; or
the LED light-emitting chip generates purple exciting light, and the quantum dot material is red, green, and blue quantum materials.

10. A backlight module, comprising a fixing component, a quantum dot light source device, and a light-uniformizing component, wherein:
the fixing component is configured to assemble the backlight module;
the quantum dot light source device is located at the light incidence side of the light-uniformizing component;
the light-uniformizing component is configured to process a light source provided by the quantum dot light source device into a planar light source projected onto a liquid crystal display panel;
the quantum dot light source device comprises:
a printed circuit board and a quantum dot package component, both of which are packaged into a closed cavity through a package bracket, wherein:
the printed circuit board is configured to power the quantum dot light source device; and an LED light-emitting chip is arranged on the side of the printed circuit board inside the package cavity, and configured to generate exciting light; and
the quantum dot package component comprises an upper substrate, a lower substrate, and a quantum dot material layer packaged between the upper substrate and the lower substrate, the quantum dot material layer is excited by the exciting light to generate excited light, there is at least one reflection point arranged on the upper substrate, and there are more light rays reflected by the at least one reflection point at the center of the upper substrate than light rays reflected at the peripheral edges of the upper substrate.

11. The backlight module according to claim 10, wherein when there are a plurality of reflection points arranged on the upper substrate, the density of the reflection points is decreasing gradually from the center of the upper substrate to the edges thereof.

12. The backlight module according to claim 10, wherein when there are a plurality of reflection points arranged on the upper substrate, the size of the reflection points at the center of the upper substrate is larger than the size of the reflection points at the edges of the upper substrate.

13. The backlight module according to claim 10, wherein the surfaces of the at least one reflection point is mirror surface.

14. The backlight module according to claim 10, wherein when there are a plurality of reflection points arranged on the upper substrate, the surfaces of the reflection points at the center of the upper substrate are mirror surfaces, and the surfaces of the reflection points at the edges of the upper substrate are diffusively reflecting surfaces.

15. The backlight module according to claim 10, wherein the reflection points are arranged on the side of the upper substrate facing the quantum dot material layer, or the side of the upper substrate against the quantum dot material layer.

16. The backlight module according to claim 10, wherein there is a dichroic light-transmitting layer arranged on the lower substrate, which can be configured to transmit the exciting light, and to reflect the excited light.

17. The backlight module according to claim 16, wherein the dichroic light-transmitting layer is arranged on the upper or lower surface of the lower substrate.

18. The backlight module according to claim 10, wherein the LED light-emitting chip generates blue exciting light, and the quantum dot material is red and green quantum materials; or
the LED light-emitting chip generates purple exciting light, and the quantum dot material is red, green, and blue quantum materials.

19. A liquid crystal display device, comprising:
a backlight module, and a liquid crystal display panel arranged above the backlight module, wherein:

the backlight module comprises a fixing component, a quantum dot light source device, and a light-uniformizing component, wherein:

the fixing component is configured to assemble the backlight module;

the quantum dot light source device is located at the light incidence side of the light-uniformizing component;

the light-uniformizing component is configured to process a light source provided by the quantum dot light source device into a planar light source projected onto the liquid crystal display panel;

the quantum dot light source device comprises:

a printed circuit board and a quantum dot package component, both of which are packaged into a closed cavity through a package bracket, wherein:

the printed circuit board is configured to power the quantum dot light source device; and an LED light-emitting chip is arranged on the side of the printed circuit board inside the package cavity, and configured to generate exciting light; and the quantum dot package component comprises an upper substrate, a lower substrate, and a quantum dot material layer packaged between the upper substrate and the lower substrate, the quantum dot material layer is excited by the exciting light to generate excited light, there is at least one reflection point arranged on the upper substrate, and there are more light rays reflected by the at least one reflection point at the center of the upper substrate than light rays reflected at the peripheral edges of the upper substrate.

20. The liquid crystal display device according to claim 19, wherein when there are a plurality of reflection points arranged on the upper substrate, the quantum dot light source device further comprises at least one of:

the density of the reflection points is decreasing gradually from the center of the upper substrate to the edges thereof;

the size of the reflection points at the center of the upper substrate is larger than the size of the reflection points at the edges of the upper substrate; and the surfaces of the reflection points at the center of the upper substrate are mirror surfaces, and the surfaces of the reflection points at the edges of the upper substrate are diffusively reflecting surfaces.

* * * * *